United States Patent [19]
Tessier et al.

[11] Patent Number: 5,661,088
[45] Date of Patent: Aug. 26, 1997

[54] ELECTRONIC COMPONENT AND METHOD OF PACKAGING

[75] Inventors: Theodore G. Tessier; Kenneth Kaskoun, both of Chandler; David A. Jandzinski, Phoenix, all of Ariz.

[73] Assignee: Motorola, Inc., Schaumburg, Ill.

[21] Appl. No.: 583,835

[22] Filed: Jan. 11, 1996

[51] Int. Cl.$^6$ .................................................. H05K 3/30
[52] U.S. Cl. ........................... 29/841; 29/853; 438/126
[58] Field of Search ............................ 29/853, 847, 835, 29/841; 437/209, 211

[56] References Cited

U.S. PATENT DOCUMENTS

| | | | |
|---|---|---|---|
| 3,557,446 | 1/1971 | Charschan | 29/853 |
| 5,355,283 | 10/1994 | Marrs et al. | |
| 5,378,869 | 1/1995 | Marrs et al. | |
| 5,527,741 | 6/1996 | Cole | 437/209 |
| 5,579,573 | 12/1996 | Baker | 29/840 |

FOREIGN PATENT DOCUMENTS 7-193098  7/1995  Japan.

OTHER PUBLICATIONS

J.W. Wilson, "UV Curable Urethane encapsulant for ceramic chip carriers, IEEE transactions on components..." vol. 17, No. 4, pp. 553–558 Dec. 1994.
Translation of JP 07–193098 (Fujitsu) Jul. 1995.

*Primary Examiner*—Jey Tsai
*Assistant Examiner*—Brendan Mee
*Attorney, Agent, or Firm*—George C. Chen

[57] ABSTRACT

A method of packaging an electronic component includes forming a hole (24) in a substrate (21) having a first surface (22) opposite a second surface (23) and disposing and patterning a malleable layer (26) over the first surface (22) and over the hole (24) of the substrate (21). The malleable layer (26) has a third surface (27) opposite a fourth surface (28). A portion (29) of the fourth surface (28) is exposed by the hole (24) in the substrate (21). An electrically conductive layer is simultaneously disposed over the portion (29) of the fourth surface (28) and over a different portion of the third surface (27) of the malleable layer (26). The malleable layer (26) is deformed into the hole (24). Then, a semiconductor die (43) is coupled to the malleable layer (26), and an underencapsulant (37) is disposed under the semiconductor die (43) and over the hole (24).

19 Claims, 1 Drawing Sheet

ELECTRONIC COMPONENT AND METHOD OF PACKAGING

BACKGROUND OF THE INVENTION

This invention relates, in general, to electronic components, and more particularly, to the packaging of electronic components.

Semiconductor dice are typically coupled to metal lead frames and then encapsulated in transfer molded plastic packages. However, conventional transfer molded plastic packages are on the order of ten to fifty times larger than the semiconductor dice. Consequently, conventional packaging schemes for electronic components are very bulky and waste space. However, other packaging schemes have recently been developed to reduce the final size of electronic components.

For example, a pin grid array (PGA) package is smaller than a conventional transfer molded plastic package and is on the order of four to ten times larger than a semiconductor die. A PGA package has an array of pins across a surface of a package body instead of along a perimeter of a conventional package. However, the array of pins in a PGA package are easily bent and damaged.

Another packaging scheme that reduces the final size of a conventionally packaged electronic component is a ball grid array (BGA) package, which is also known as an overmolded pad array carrier. A BGA package is on the order of two to eight times larger than a semiconductor die and is typically smaller than a PGA package. A BGA package contains an assembly substrate with an array of holes that are plated or otherwise filled with a metal. The array of plated holes couple metal traces located on one side of the assembly substrate to an array of solder balls located on an opposite side of the assembly substrate. At least one semiconductor die is coupled to the metal traces on the assembly substrate, and the array of solder balls is coupled to a circuit board. While conventional BGA packages reduce the size of a packaged electronic component, BGA packages require an expensive, time consuming, and complicated manufacturing process.

Accordingly, a need exists for packaging an electronic component that reduces the final size of conventional electronic components. The method of packaging the electronic component should be cost-effective, simple, and manufacturable. Additionally, the packaging process should not significantly increase the cycle time of manufacturing an electronic component.

DETAILED DESCRIPTION OF THE DRAWINGS

Figure 1:
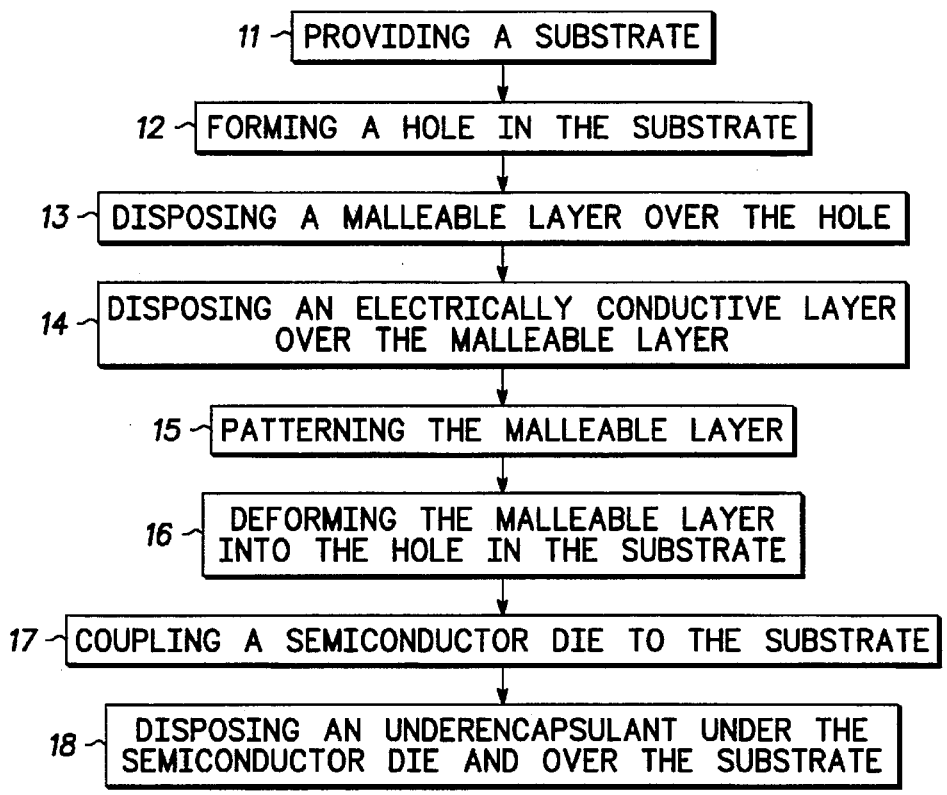
FIG. 1 outlines an embodiment of a method of packaging a semiconductor die in accordance with the present invention.

Turning to the figures for a more detailed description, FIG. 1 outlines an embodiment of a method of packaging a semiconductor die in accordance with the present invention. A process or method 10 begins with steps 11 and 12, which provide a substrate and which form a hole in the substrate, respectively. Method 10 also includes steps 13-18, which are described hereinafter.

Figure 2:
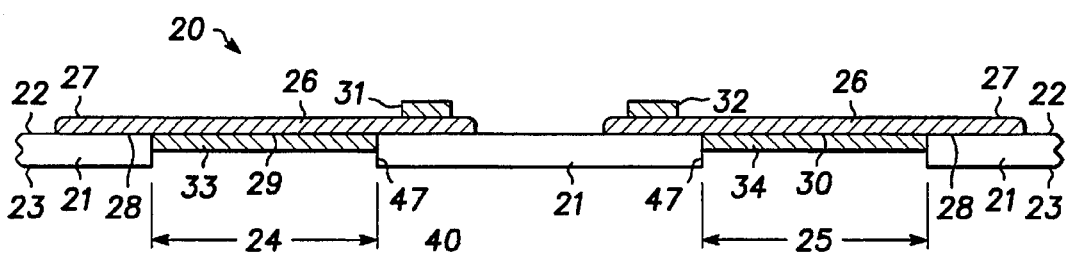
FIGS. 2 and 3 illustrate enlarged cross-sectional views of an embodiment of an electronic component during packaging in accordance with the present invention.

Continuing with the next figure, FIG. 2 illustrates an enlarged cross-sectional view of an embodiment of an electronic component during the packaging process of FIG. 1 in accordance with the present invention. In particular, FIG. 2 depicts an electronic component 40 having an assembly substrate 20 comprised of a laminate including a substrate 21 with holes 24 and 25, a malleable layer 26, and electrically conductive layers 31, 32, 33, and 34. The substrate of step 11 in FIG. 1 is depicted as substrate 21 in FIG. 2, and the hole formed by step 12 in FIG. 1 is depicted as hole 24 or hole 25 in FIG. 2.

Substrate 21 has a surface 22 that is opposite a surface 23. In the preferred embodiment, substrate 21 has a thickness of approximately 25-75 microns. Substrate 21 can be comprised of materials including, but not limited to, ceramics, polymers, or organic epoxy-glass resins. Other printed circuit or wiring board materials can also be used for substrate 21. However, substrate 21 preferably comprises a dielectric material such as, for example, a flexible polyimide film. Substrate 21 is preferably flexible so that it is compatible with reel to reel assembly processes and tape grid array technologies. In other words, substrate 21 is preferably part of a long strip of flexible material from which many electronic components can be manufactured.

Holes 24 and 25 extend from surface 22 to surface 23 of substrate 21 and have sidewalls 47. Holes 24 and 25 can be formed in substrate 21 using a variety of conventional techniques including, but not limited to, a laser cutting process, a mechanical drilling process, or a patterned chemical etching process. However, holes 24 and 25 are preferably formed using a mechanical stamping technique known in the art.

It is understood that the actual number and position of the holes in substrate 21 depend upon the number and position of electrical contacts of a semiconductor die coupled to substrate 21 as will be seen hereinafter. The actual number and position of the holes in substrate 21 also depend upon the layout of a circuit board (not shown) to which electronic component 40 is coupled or attached. In the preferred embodiment, substrate 21 contains less than 100 holes. In the illustrated embodiment of FIG. 2, holes 24 and 25 each have a circular cross-section with a diameter of approximately 200-400 microns.

Referring back to FIG. 1, method 10 continues with step 13 by disposing a malleable layer over the hole in the substrate. The result of step 13 is portrayed in FIG. 2 with malleable layer 26 disposed over holes 24 and 25 of substrate 21. In addition to being malleable or ductile, malleable layer 26 is also electrically conductive. For example, malleable layer 26 can be comprised of a copper foil or copper film approximately 10-25 microns thick. The precise thickness of malleable layer 26 depends upon a dimpling process described hereinafter.

In the preferred embodiment, malleable layer 26 is comprised of approximately 0.015-0.035 micron of gold, which is located over approximately 0.04-0.06 micron of nickel, which is located over the aforementioned copper film. In an alternative embodiment, malleable layer 26 is comprised of other electrically conductive and malleable materials such as, for example, aluminum, silver, or the like.

Malleable layer 26 has a surface 27, which faces away from substrate 21, and also has a surface 28, which is opposite surface 27 and which faces towards substrate 21. A portion 29 of surface 28 is exposed by hole 24 as viewed from surface 23 of substrate 21. Similarly, a portion 30 of surface 28 is exposed by hole 25.

Malleable layer 26 is coupled to substrate 21 using an adhesive layer (not shown). Preferably, the adhesive layer is comprised of a low flow epoxy or acrylic to prevent the adhesive layer from flowing or leaking on portions 29 and 30 of malleable layer 26. The adhesive layer should not interfere with a subsequent plating process described hereinafter.

In an alternative embodiment, step 13 of method 10 is performed before the hole formation of step 12. In this alternative embodiment where step 13 occurs before step 12, step 12 should use an etching technique or other hole formation process that does not significantly etch or otherwise affect malleable layer 26.

Continuing with method 10 in FIG. 1, step 14 disposes an electrically conductive layer over the malleable layer. As represented in FIG. 2, electrically conductive layers 31 and 32 overlie surface 27 of malleable layer 26, and electrically conductive layers 33 and 34 overlie portions 29 and 30, respectively, in surface 28 of malleable layer 26.

In the preferred embodiment, electrically conductive layers 31, 32, 33, and 34 are comprised of a solder containing, for example, 60 percent tin and 40 percent lead. It is understood that other types and compositions of solder or other electrically conductive materials can also be used for electrically conductive layers 31, 32, 33, and 34.

Also in the preferred embodiment, electrically conductive layers 31, 32, 33, and 34 are simultaneously electroplated over their respective regions or areas of malleable layer 26. In this embodiment, a masking layer such as, for example, a photoresist pattern, is used to define the regions or areas of surface 27 that are to be plated during step 14. Substrate 21 is used as a masking layer to define the regions or areas of surface 28 that are to be plated during step 14.

Also in the preferred embodiment, electrically conductive layers 31, 32, 33, and 34 are plated to a thickness that is less than a thickness of substrate 21. In the preferred embodiment where the thickness of substrate 21 is approximately 25–75 microns, the thickness of electrically conductive layers 31, 32, 33, and 34 is preferably approximately 15–35 microns.

Next, as indicated in step 15 of method 10 in FIG. 1, the malleable layer is patterned. As portrayed in FIG. 2, malleable layer 26 is already patterned by step 15. The patterning of step 15 can be accomplished by a patterned etch technique or other conventional processes. In the preferred embodiment where malleable layer 26 is comprised of copper, step 15 creates a patterned copper film overlying substrate 21.

Each malleable layer 26 can have a different shape or pattern. In the preferred embodiment, malleable layer 26 has a circular shape that completely covers the preferred circular cross-section of holes 24 and 25. However, in an alternative embodiment, malleable layer 26 has a shape or pattern that does not fully cover the entire opening of hole 24 or hole 25 along surface 22 of substrate 21. In this alternative embodiment, a portion of hole 24 or hole 25 is exposed along surface 22 of substrate 21.

Figure 3:
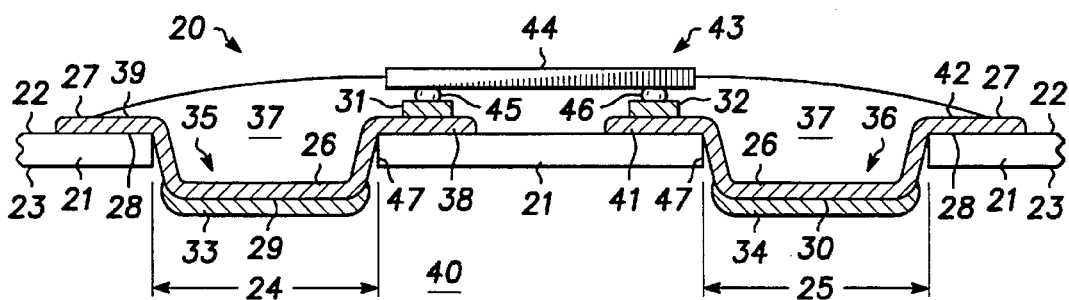

Method 10 continues with step 16, which deforms the malleable layer into the hole in the substrate. The completion of step 16 is depicted in FIG. 3, which illustrates an enlarged cross-sectional view of an embodiment of an electronic component during the packaging process of FIG. 1 in accordance with the present invention. Elements of FIG. 3 that have the same reference numerals as FIG. 2 are the same as the corresponding FIG. 2 elements. FIG. 3 illustrates, among other features, a semiconductor die 43 and an underencapsulant 37 overlying assembly substrate 20. Specifically referring to step 16 of FIG. 1, FIG. 3 depicts malleable layer 26 deformed into holes 24 and 25. As a result of step 16, malleable layer 26 forms dimples 35 and 36 in or through holes 24 and 25, respectively.

In the preferred embodiment, malleable layer 26 is not adhered to sidewalls 47 of holes 24 and 25. In other words, malleable layer 26 is devoid of attachment to substrate 21 along sidewalls 47 of holes 24 and 25. Malleable layer 26 and dimples 35 and 36 do not need to be supported by the sidewalls of holes 24 and 25. Instead, malleable layer 26 is preferably only attached to substrate 21 along surface 22.

Also in the preferred embodiment, a conventional dimple tool (not shown) simultaneously pushes or deforms malleable layer 26 into holes 24 and 25 to form dimples 35 and 36, respectively. Preferably, malleable layer 26 extends or protrudes through holes 24 and 25 and beyond surface 23 of substrate 21. However, regardless of how far malleable layer 26 is pushed or deformed into holes 24 and 25, electrically conductive layers 33 and 34 should extend beyond surface 23 of substrate 21 as a result of step 16 to facilitate electrical coupling of electrically conductive layers 33 and 34 to another electronic component (not shown). Preferably, as illustrated in FIG. 3, portions 38, 39, 41, and 42 of malleable layer 26 remain over a portion of surface 22 of substrate 21 upon completion of step 16.

The thickness of malleable layer 26 depends upon the magnitude of deformation in step 16. Preferably, malleable layer 26 does not break, crack, or separate from substrate 21 during step 16. Therefore, malleable layer 26 can be thinner when a smaller deformation is desired, and malleable layer 26 can be thicker when a larger deformation is desired in step 16. However, malleable layer 26 should not be too thick to make the dimpling process of step 16 difficult to accomplish. Preferably, step 16 deforms malleable layer 26 by approximately 50–250 microns. Typically, step 16 pushes malleable layer 26 a distance of approximately 1–3 times the thickness of substrate 21 away from surface 22 of substrate 21.

During the formation of dimples 35 and 36 in step 16, assembly substrate 20 is preferably supported along surface 23 of substrate 21 by a support substrate (not shown). The support substrate has recesses that are aligned to receive dimples 35 and 36 while the dimple tool pushes against surface 27 of malleable layer 26. In the preferred embodiment of step 16, the dimple tool will not deform malleable layer 26 too far because the depth of the aligned recesses of the support substrate determine or limit how far malleable layer 26 can be deformed. In an alternative embodiment, the deformation process of step 16 is performed before the patterning process of step 15.

Returning to FIG. 1, method 10 proceeds with step 17, which couples a semiconductor die to the substrate. The completion of step 17 is illustrated in FIG. 3 with semiconductor die 43 coupled to assembly substrate 20. Semiconductor die 43 comprises a semiconductor substrate 44 and bumps 45 and 46. As depicted in FIG. 3, semiconductor die 43 is a flip chip device. Semiconductor substrate 44 is preferably comprised of a semiconductor material such as, for example, silicon or gallium arsenide. Semiconductor substrate 44 contains a semiconductor device such as, for example, a field effect transistor. Preferably, semiconductor substrate 44 contains a plurality of semiconductor devices that are coupled together to form an integrated circuit. Bumps 45 and 46 of semiconductor die 43 are electrically coupled to the semiconductor device or devices contained within semiconductor substrate 44.

Bumps 45 and 46 are aligned and coupled to electrically conductive layers 31 and 32, respectively. Bumps 45 and 46 are coupled to electrically conductive layers 33 and 34, respectively, by malleable layer 26. In the preferred embodiment, bumps 45 and 46 are comprised of solder and are subjected to a reflow process at approximately 160–220 degrees Celsius (° C.) after positioning, placing, or aligning bumps 45 and 46 to electrically conductive layers 31 and 32, respectively. In an alternative embodiment, bumps 45 and 46 are comprised of copper, gold, or other flip chip bump materials that are well known to those skilled in the art.

In an alternative embodiment, the coupling of semiconductor die 43 in step 17 is performed prior to the deformation of malleable layer 26 in step 16. In this alternative embodiment where step 17 occurs prior to step 16, the dimpling tool should ensure that semiconductor die 43 is not damaged during the dimpling process of step 16.

In yet another alternative embodiment, the coupling of semiconductor die 43 in step 17 is performed before the patterning of malleable layer 26 in step 15. In this alternative embodiment where step 17 occurs before step 15, the patterning process of step 15 should not damage semiconductor die 43.

Method 10 in FIG. 1 also includes step 18, which disposes an underencapsulant under the semiconductor die and over the substrate. The completion of step 18 is also depicted in FIG. 3. In the illustrated embodiment, underencapsulant 37 is located between semiconductor die 43 and substrate 21 and is also located in and over dimples 35 and 36, which are in holes 24 and 25, respectively.

In an undepicted embodiment, underencapsulant 37 also covers or encapsulates malleable layer 26 to protect malleable layer 26 from corrosion and electrical shorting. Underencapsulant 37 can also completely cover or encapsulate semiconductor die 43.

Underencapsulant 37 is electrically insulating and should be impervious to moisture and other contaminants in the atmosphere. Underencapsulant 37 serves to protect semiconductor die 43 and the electrical connections between semiconductor die 43 and assembly substrate 20. Furthermore, underencapsulant 37 serves to strengthen and maintain the shape of dimples 35 and 36 by preventing dimples 35 and 36 from deforming back into holes 24 and 25, respectively, during the handling of electronic component 40 or during the mounting of electronic component 40 onto a circuit board (not shown).

In the preferred embodiment, underencapsulant 37 is comprised of a silica-filled epoxy-acrylate and is dispensed onto assembly substrate 20 around a perimeter of semiconductor die 43. A capillary force wicks or draws the silica-filled epoxy-acrylate underneath semiconductor die 43. Preferably, the silica-filled epoxy-acrylate is cured for approximately 1–2 hours at about 130°–160° C. It is understood that other suitable underencapsulants can also be used for underencapsulant 37.

After the encapsulation process of step 18, electronic component 40 is separated, singulated, or excised from the preferred long strip of flexible material to which substrate 21 is attached. Then, electronic component 40 can be mounted on a circuit board (not shown), wherein electrically conductive layers 33 and 34 are aligned to metal traces on the circuit board.

In an alternative embodiment, underencapsulant 37 of step 18 is disposed over a portion of assembly substrate 20 before the deformation or dimpling process of step 16. In this embodiment where step 18 occurs before step 16, underencapsulant 37 is not cured until after the formation of dimples 35 and 36. However, the dimpling tool should not be contaminated by the underencapsulant.

Additionally, in yet another alternative embodiment, underencapsulant 37 of step 18 is disposed over a portion of assembly substrate 20 prior to the coupling of semiconductor die 43 in step 17. However, care should be taken to ensure proper electrical contact between bumps 45 and 46 and electrically conductive layers 31 and 32, respectively. Underencapsulant 37 should protect but should not interfere with the electrical coupling between semiconductor die 43 and assembly substrate 20.

Method 10 describes a cost-effective process for manufacturing an electronic component package that is smaller than conventional transfer molded plastic packages used with leadframe components. Method 10 is less expensive than conventional ball grid array (BGA) packaging processes because BGA packaging processes use a first plating process to form electrical contacts on a first side of an assembly substrate facing a semiconductor die and then use a second plating process to form solder balls over a second side of an assembly substrate opposite the semiconductor die. However, instead of using two solder plating processes, the present invention uses a single plating process and then uses an inexpensive and less time consuming dimpling process to form electrical contacts for electronic component 40. Consequently, method 10 manufactures a ball-less surface mountable area array package that is both faster and cheaper than conventional BGA packaging processes.

While the invention has been particularly shown and described with reference to preferred embodiments, it will be understood by those skilled in the art that changes in form and detail may be made without departing from the spirit and scope of the invention. For instance, in an alternative embodiment, step 14 of method 10 uses an electroless plating process for disposing electrically conductive layers 31, 32, 33, and 34 overlying malleable layer 26. As an additional example, semiconductor die 43 can be wire bonded to assembly substrate 20. Furthermore, a plurality of assembly substrates, each of which are similar to assembly substrate 20, can be coupled together to provide a more intricate routing or wiring pattern. Yet another alternative embodiment includes a plurality of semiconductor dice coupled to assembly substrate 20.

Therefore, in accordance with the present invention, it is apparent there has been provided an improved electronic component that overcomes the disadvantages of the prior art. The present invention eliminates the inefficient space consumption of leadframe devices and reduces the cycle time, complexity, and cost of packaging a semiconductor die.

We claim:

1. A method of manufacturing an electronic component, the method comprising:

providing a substrate having a hole extending from a first surface of the substrate to a second surface of the substrate;

disposing a malleable layer overlying the first surface of the substrate and overlying the hole;

disposing an electrically conductive layer in the hole prior to deforming the malleable layer, the electrically conductive layer disposed to be electrically coupled to the malleable layer;

deforming the malleable layer into the hole, the malleable layer extending from the first surface of the substrate toward the second surface of the substrate and the malleable layer remaining continuous in the hole; and disposing an encapsulant into the hole.

2. The method according to claim 1, wherein the step of providing the substrate includes providing a first thickness of approximately 25–75 microns for the substrate and providing a circular cross-section with a diameter of approximately 200–400 microns for the hole in the substrate, wherein the step of disposing the malleable layer includes providing a second thickness of approximately 10–25 microns for the malleable layer, and wherein the step of deforming the malleable layer includes deforming the malleable layer by approximately 50–250 microns.

3. A method of manufacturing an electronic component, the method comprising:

providing a substrate having a hole extending from a first surface of the substrate to a second surface of the substrate;

disposing a malleable layer overlying the first surface of the substrate and overlying the hole;

disposing an electrically conductive layer in the hole prior to deforming the malleable layer, the electrically conductive layer disposed to be electrically coupled to the malleable layer;

deforming the malleable layer into the hole, the malleable layer extending from the first surface of the substrate toward the second surface of the substrate and the malleable layer remaining continuous in the hole; and selecting the malleable layer from the group consisting of copper, gold, or aluminum, wherein a portion of the hole is exposed along the first surface of the substrate.

4. The method according to claim 1, further comprising the step of providing a semiconductor substrate over the first surface of the substrate and over a portion of the malleable layer wherein the step of disposing the encapsulant includes disposing the encapsulant between the semiconductor substrate and the portion of the malleable layer.

5. The method according to claim 1, further comprising the step of coupling a flip chip device to the malleable layer, the flip chip device located over a portion of the first surface of the substrate, wherein the step of providing the substrate includes providing a flexible polyimide film for the substrate.

6. The method according to claim 1 wherein the step of deforming the malleable layer includes keeping the malleable layer from being attached to a sidewall of the hole.

7. The method according to claim 1 wherein the step of disposing the malleable layer further comprises:

disposing a first malleable layer overlying the first surface of the substrate; and disposing a second malleable layer overlying the first malleable layer wherein an end of the first malleable layer is contiguous with an end of the second malleable layer.

8. The method according to claim 1 wherein the step of disposing the electrically conductive layer includes using the substrate as a masking layer.

9. A method of fabricating an electronic component, the method comprising the steps of:

providing a substrate having a first surface opposite a second surface;

forming a hole in the substrate;

adhering a metallic film to the first surface of the substrate, the metallic film having a third surface facing away from the substrate and a fourth surface opposite the third surface and facing towards the substrate, the fourth surface having a first portion exposed by the hole in the substrate;

patterning the metallic film;

pushing the metallic film into the hole in the substrate, wherein the metallic film forms a dimple in the hole, the third surface of the metallic film having a second portion remaining over a portion of the first surface of the substrate;

coupling a semiconductor die to the second portion of the third surface of the metallic film, the semiconductor die overlying the first surface of the substrate; and disposing an underencapsulant in the dimple and between the semiconductor die and the substrate.

10. The method according to claim 9, further comprising the step of simultaneously plating an electrically conductive layer over the second portion of the third surface of the metallic film and over the first portion of the fourth surface of the metallic film.

11. The method according to claim 10, wherein the step of simultaneously plating the electrically conductive layer occurs before the step of pushing the metallic film into the hole in the substrate.

12. The method according to claim 10, wherein the step of simultaneously plating the electrically conductive layer includes plating the electrically conductive layer to a first thickness less than a thickness of the substrate.

13. The method according to claim 10, wherein the step of simultaneously plating the electrically conductive layer includes providing solder for the electrically conductive layer and wherein the step of disposing the underencapsulant includes providing a silica-filled epoxy-acrylate for the underencapsulant.

14. The method according to claim 10 wherein the step of pushing the metallic film includes exposing a portion of the fourth surface of the metallic film.

15. The method according to claim 9, wherein the step of pushing the metallic film includes pushing the metallic film a distance of approximately 1–3 times a thickness of the substrate.

16. The method according to claim 9 wherein the step of pushing the metallic film includes providing a plurality of metallic layers for the metallic film wherein each of the plurality of metallic layers has a different composition and wherein an end of one of the plurality of metallic layers physically contacts an end of another one of the plurality of metallic layers.

17. A method of manufacturing an electronic component, the method comprising:

providing a substrate having a hole extending from a first surface of the substrate to a second surface of the substrate;

disposing a malleable layer overlying the first surface of the substrate and overlying the hole;

disposing an electrically conductive layer in the hole prior to deforming the malleable layer, the electrically conductive layer disposed to be electrically coupled to the malleable layer;

deforming the malleable layer into the hole, the malleable layer extending from the first surface of the substrate toward the second surface of the substrate and the malleable layer remaining continuous in the hole; and disposing an electrically insulating material in the hole after deforming the malleable layer into the hole.

18. The method according to claim 17 wherein the step of deforming the malleable layer includes pushing the malleable layer towards the second surface of the substrate and wherein the step of disposing the electrically insulating material includes disposing the electrically insulating material into the hole from the first surface of the substrate.

19. A method of fabricating an electronic component, the method comprising the steps of:

providing a substrate having a first surface opposite a second surface;

forming a hole in the substrate;

adhering a metallic film to the first surface of the substrate, the metallic film having a third surface facing away from the substrate and a fourth surface opposite the third surface and facing towards the substrate, the fourth surface having a first portion exposed by the hole in the substrate;

patterning the metallic film;

pushing the metallic film into the hole in the substrate, wherein the metallic film forms a dimple in the hole, the third surface of the metallic film having a second portion remaining over a portion of the first surface of the substrate;

coupling a semiconductor die to the second portion of the third surface of the metallic film, the semiconductor die overlying the first surface of the substrate; and disposing an underencapsulant overlying the dimple and between the semiconductor die and the substrate, wherein the step of disposing the underencapsulant includes disposing the underencapsulant in the hole.

* * * * *